(12) United States Patent
Sumiya et al.

(10) Patent No.: US 9,217,910 B2
(45) Date of Patent: Dec. 22, 2015

(54) INORGANIC OPTICAL FILTER, OPTICAL ELEMENT, AND LIGHT SOURCE

(75) Inventors: Keiji Sumiya, Tsukuba (JP); Kiyoshi Shimamura, Tsukuba (JP); Garcia Villora, Tsukuba (JP)

(73) Assignee: National Institute for Materials Science, Tsukuba-shi, Ibaraki (JP)

( * ) Notice: Subject to any disclaimer, the term of this patent is extended or adjusted under 35 U.S.C. 154(b) by 907 days.

(21) Appl. No.: 13/498,719

(22) PCT Filed: Sep. 14, 2010

(86) PCT No.: PCT/JP2010/065833
§ 371 (c)(1),
(2), (4) Date: May 25, 2012

(87) PCT Pub. No.: WO2011/040232
PCT Pub. Date: Apr. 7, 2011

(65) Prior Publication Data
US 2012/0230032 A1    Sep. 13, 2012

(30) Foreign Application Priority Data
Sep. 29, 2009 (JP) ............... P2009-225155

(51) Int. Cl.
| | |
|---|---|
| G02F 1/35 | (2006.01) |
| G02F 1/37 | (2006.01) |
| C30B 11/00 | (2006.01) |
| C30B 29/12 | (2006.01) |

(Continued)

(52) U.S. Cl.
CPC . *G02F 1/37* (2013.01); *C30B 11/00* (2013.01); *C30B 29/12* (2013.01); *G02B 5/22* (2013.01); *G02F 1/355* (2013.01); *G02F 1/3558* (2013.01); *G02F 2001/3548* (2013.01)

(58) Field of Classification Search
None
See application file for complete search history.

(56) References Cited

U.S. PATENT DOCUMENTS 3,982,136 A * 9/1976 Bergman et al. ............... 359/328
5,339,189 A    8/1994 Boczar
(Continued)

FOREIGN PATENT DOCUMENTS

JP    H0345904 A    2/1991
JP    2005001933 A *    1/2005
(Continued)

OTHER PUBLICATIONS

Furuya et al, "Crystal growth and scintillation properties of NdF3 single crystal", 2009 IEEE Nuclear Science Symposium Conference Record, pp. 1501-1504.*

(Continued)

*Primary Examiner* — Hemang Sanghavi
(74) *Attorney, Agent, or Firm* — Leydig, Voit & Mayer

(57) ABSTRACT

The inorganic optical filter of the invention consists of a $NdF_3$ single crystal. The optical element of the invention comprises a wavelength conversion element wherein incident light is subjected to wavelength conversion to twice the frequency by quasi-phase-matching using primary matching or tertiary matching, and emitted, and an inorganic optical filter situated in the optical path of light emitted from the wavelength conversion element, wherein the wavelength conversion element consists of a ferroelectric fluoride single crystal represented by $Ba_{1-y}(Mg_{1-x}Zn_x)_{1+y}F_4$ (where $0 \leq x \leq 1$, and $-0.2 \leq y \leq 0.2$), and the inorganic optical filter consists of a $NdF_3$ single crystal.

8 Claims, 4 Drawing Sheets

(51) Int. Cl.
*G02B 5/22* (2006.01)
*G02F 1/355* (2006.01)

(56) References Cited

U.S. PATENT DOCUMENTS

| | | | |
|---|---|---|---|
| 5,646,781 A | 7/1997 | Johnson | |
| 5,940,417 A * | 8/1999 | Wu | C30B 15/00 117/13 |
| 6,525,806 B1 * | 2/2003 | Smith | G03F 7/70308 355/53 |
| 2007/0272898 A1 * | 11/2007 | Yoshikawa et al. | 252/301.4 H |

FOREIGN PATENT DOCUMENTS

| JP | 2005-119952 | 5/2005 |
|---|---|---|
| JP | 2005-345492 | 12/2005 |
| WO | WO 2009/069706 A1 | 6/2009 |
| WO | WO 2009/139473 A1 | 11/2009 |

OTHER PUBLICATIONS

Caro, P. et al., "Interpretation of the optical absorption spectrum and of the paramagnetic susceptibility of neodymium trifluoride", *J. Chem. Phys.*, 74 (5), Mar. 1, 1981, pp. 2698-2704.
European Extended Search Report, Application No. 10820351.4, dated Mar. 7, 2013.
Shimamura K. et al., *Journal of Crystal Growth*, 264, 208-215, (2004).
International Search Report, Application No. PCT/JP2010/065833, mailed Dec. 28, 2010.
International Preliminary Report on Patentability, Application No. PCT/JP2010/065833, dated May 1, 2012.

* cited by examiner (a)

(b)

INORGANIC OPTICAL FILTER, OPTICAL ELEMENT, AND LIGHT SOURCE

TECHNICAL FIELD

The present invention relates to an inorganic optical filter, an optical element and a light source.

BACKGROUND ART

Excimer lasers employing KrF or ArF are utilized as light sources for semiconductor lithography apparatuses and corrective devices. Such light sources, however, are known to have disadvantages such as short life spans, toxicity, and poor beam quality.

Research is therefore being directed toward fully solid lasers that are combinations of solid lasers and wavelength conversion elements. Some wavelength conversion elements utilize the nonlinear optic effect of second harmonic generation (SHG), which emits light at twice the frequency of incident light (second harmonic), and there have already been proposed wavelength conversion elements composed of nonlinear optical crystals (see Non-patent document 1, for example).

An outgoing beam from a wavelength conversion element utilizing SHG is a mixture of light of at least two different wavelengths, that of the fundamental wave as the incident beam and that of the second harmonic by SHG. For purposes that require light of a prescribed short wavelength, such as semiconductor lithography apparatuses and corrective devices, it is preferred to allow activity of only the second harmonic, in order to avoid other light effects.

Optical filters are known as a means of selectively extracting light of a specific wavelength. One type of optical filter is a polarized light filter, and for example, Dichronic Color Filte by Thorlabs is well known. However, even when such an optical filter is combined with a wavelength conversion element that accomplishes wavelength conversion of solid laser light in the visible to near-infrared range to emit second harmonic waves from the ultraviolet/vacuum ultraviolet (UV/VUV) range to the visible range, it is often the case that the fundamental wave is not sufficiently removed. Incidentally, the fundamental wave can be removed by combining multiple optical filters or increasing the filter thickness, but this method introduces the problem of significant reduction in second harmonic output.

At the same time, single crystals are being developed as scintillator materials (see Non-patent document 2, for example). According to Non-patent document 2, high-quality $CeF_3$ and $NdF_3$ single crystals can be obtained. However, application of these single crystals to optical parts has not been reported.

CITATION LIST

Non-Patent Literature

[Non-patent Document 1] Miyazawa, S., "Polarization Reversal Devices—Fundamentals and Applications", Optronics, (2005).
[Non-patent document 2] K. Shimamura et al., J. Cryst. Growth, 264(2004), 208-215

SUMMARY OF INVENTION

Technical Problem

The present invention has been accomplished in light of these circumstances, and its object is to provide an optical element that allows a second harmonic with adequately low mixing of the fundamental wave to be obtained at high conversion efficiency from solid laser light, an inorganic optical filter to be used in the optical element, allowing the fundamental wave to be sufficiently removed without lowering second harmonic output, and a light source employing the optical element.

Solution to Problem

The inorganic optical filter of the invention consists of a $NdF_3$ single crystal. The inorganic optical filter of the invention has a plurality of ranges in the light transmitting spectrum, a wavelength range exhibiting a high blocking property and a wavelength range exhibiting high transparency, so that it is possible to provide flexibility in the construction of optical systems for users. Furthermore, since there is no need for a combination of multiple optical filters, using the inorganic optical filter of the invention allows downsizing and cost reduction for optical systems.

In an inorganic optical filter of the invention, the $NdF_3$ single crystal has 4 wavelength ranges with transmittance of no greater than 1% within the wavelength range of 550-900 nm, and preferably the transmittance in each of the half-wavelength ranges corresponding to the 4 wavelength ranges is 50% or greater.

Also, the 4 wavelength ranges are preferably in the range between 565 nm and 585 nm, in the range between 726 nm and 747 nm, in the range between 778 nm and 812 nm and in the range between 855 nm and 870 nm.

The optical element of the invention comprises a wavelength conversion element wherein incident light is subjected to wavelength conversion to twice the frequency by quasi-phase-matching using primary matching or tertiary matching, and emitted, and the aforementioned inorganic optical filter situated in the optical path of light emitted from the wavelength conversion element, wherein the wavelength conversion element consists of a ferroelectric fluoride single crystal represented by $Ba_{1-y}(Mg_{1-x}Zn_x)_{1+y}F_4$ (where $0 \leq x \leq 1$, and $-0.2 \leq y \leq 0.2$).

According to the optical element of the invention, it is possible to obtain a second harmonic with sufficiently low mixing of the fundamental wave from solid laser light, with high conversion efficiency. The present inventors believe the reason for this to be that the wavelength conversion element consisting of the aforementioned specific single crystal allows efficient conversion to the second harmonic from solid laser light in the visible range to near-infrared range, and that the inorganic optical filter consisting of the aforementioned specific single crystal has a plurality of wavelength ranges exhibiting a high blocking property and wavelength ranges exhibiting high transparency in the light transmitting spectrum, with the wavelength of the laser light matching the former and the wavelength of the second harmonic matching the latter.

In the optical element of the invention, the ferroelectric fluoride single crystal is preferably a $BaMgF_4$ single crystal, from the viewpoint of obtaining more excellent transparency, and especially more excellent transparency in the vacuum ultraviolet range, compared to an oxide-based optical crystal.

The invention provides a light source comprising an optical element of the invention and a solid laser which directs laser light to a wavelength conversion element of the optical element. According to the light source of the invention, an optical element of the invention is combined with a solid laser to allow a fully solid laser to be obtained which emits a second harmonic with sufficiently low mixture of the fundamental wave, at a sufficient output.

The wavelength of the laser light is preferably in the wavelength range with a transmittance of no greater than 3% within the light transmitting spectrum of the inorganic optical filter.

Advantageous Effects of Invention

According to the invention it is possible to provide an inorganic optical filter that has a filter function for a plurality of wavelength ranges, an optical element that can yield a second harmonic from solid laser light with sufficiently low mixture of the fundamental wave, at a high conversion efficiency, and a light source employing the same.

DESCRIPTION OF EMBODIMENTS

Figure 1:
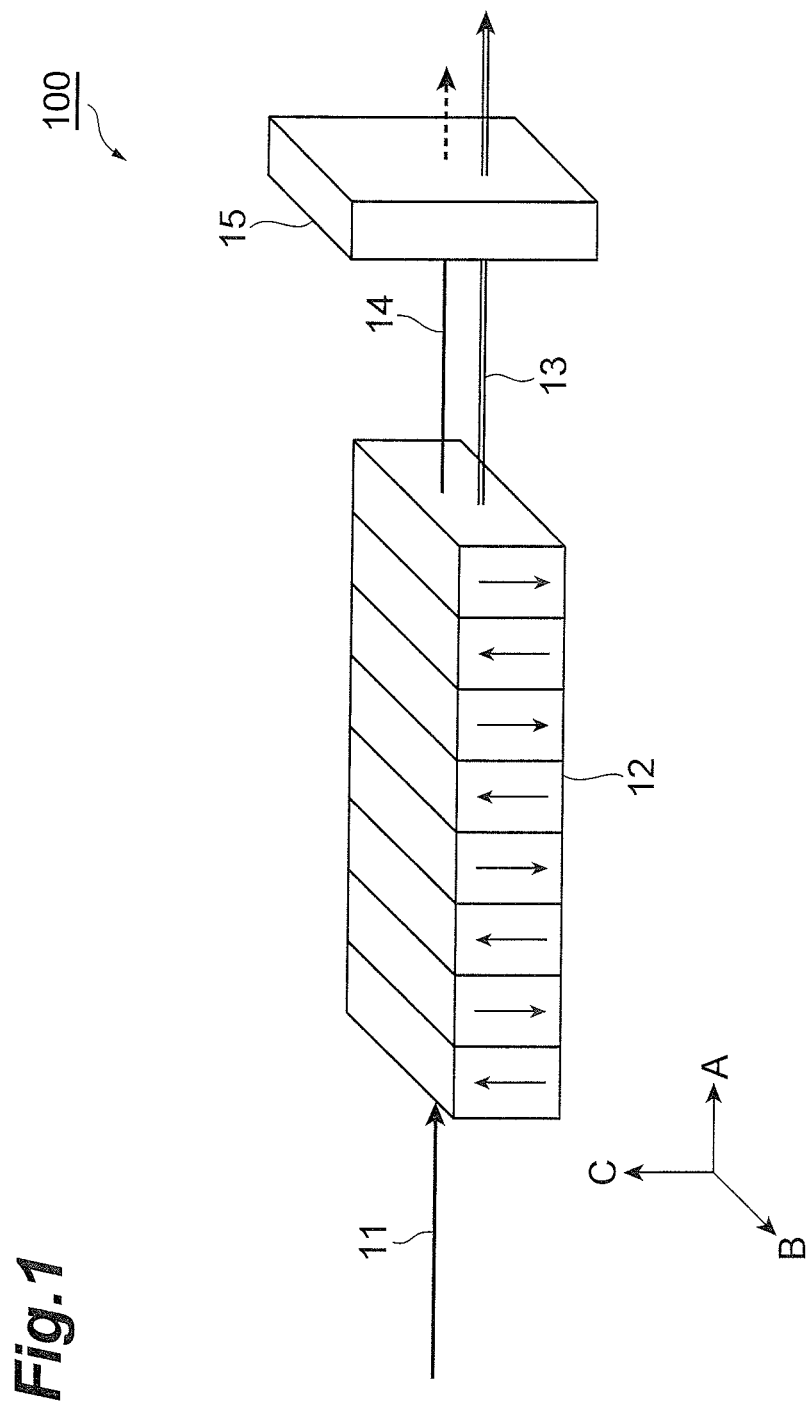
FIG. 1 is a schematic diagram showing wavelength conversion and removal of the fundamental wave, using an optical element of the invention.

FIG. 1 is a schematic diagram showing wavelength conversion and removal of the fundamental wave, using an optical element of the invention. The optical element 100 shown in FIG. 1 is composed of a wavelength conversion element 12 that accomplishes wavelength conversion and emission of incident light to twice the frequency by quasi-phase-matching using primary matching or tertiary matching, and an inorganic optical filter 15 situated in the optical path of light emitted from the wavelength conversion element 12. The wavelength conversion element 12 converts an incident beam 11 to the second harmonic 13 by SHG. The outgoing beam from the wavelength conversion element 12 is a mixture of light of at least 2 different wavelengths, namely the fundamental wave 14 of the incident beam and the second harmonic 13 produced by SHG, but a second harmonic with sufficiently low mixture of the fundamental wave is obtained by the inorganic optical filter 15.

The wavelength conversion element 12 consisting of a ferroelectric fluoride single crystal represented by $Ba_{1-y}(Mg_{1-x}Zn_x)_{1+y}F_4$ (where $0 \le x \le 1$, and $-0.2 \le y \le 0.2$). The ferroelectric fluoride also more preferably has ferroelectricity, with a coercive electric field value of no greater than 10 kV/cm at frequencies of up to 1 Hz.

The ferroelectric fluoride single crystal composing the wavelength conversion element 12 will now be described, for a case employing $BaMgF_4$.

Figure 2:
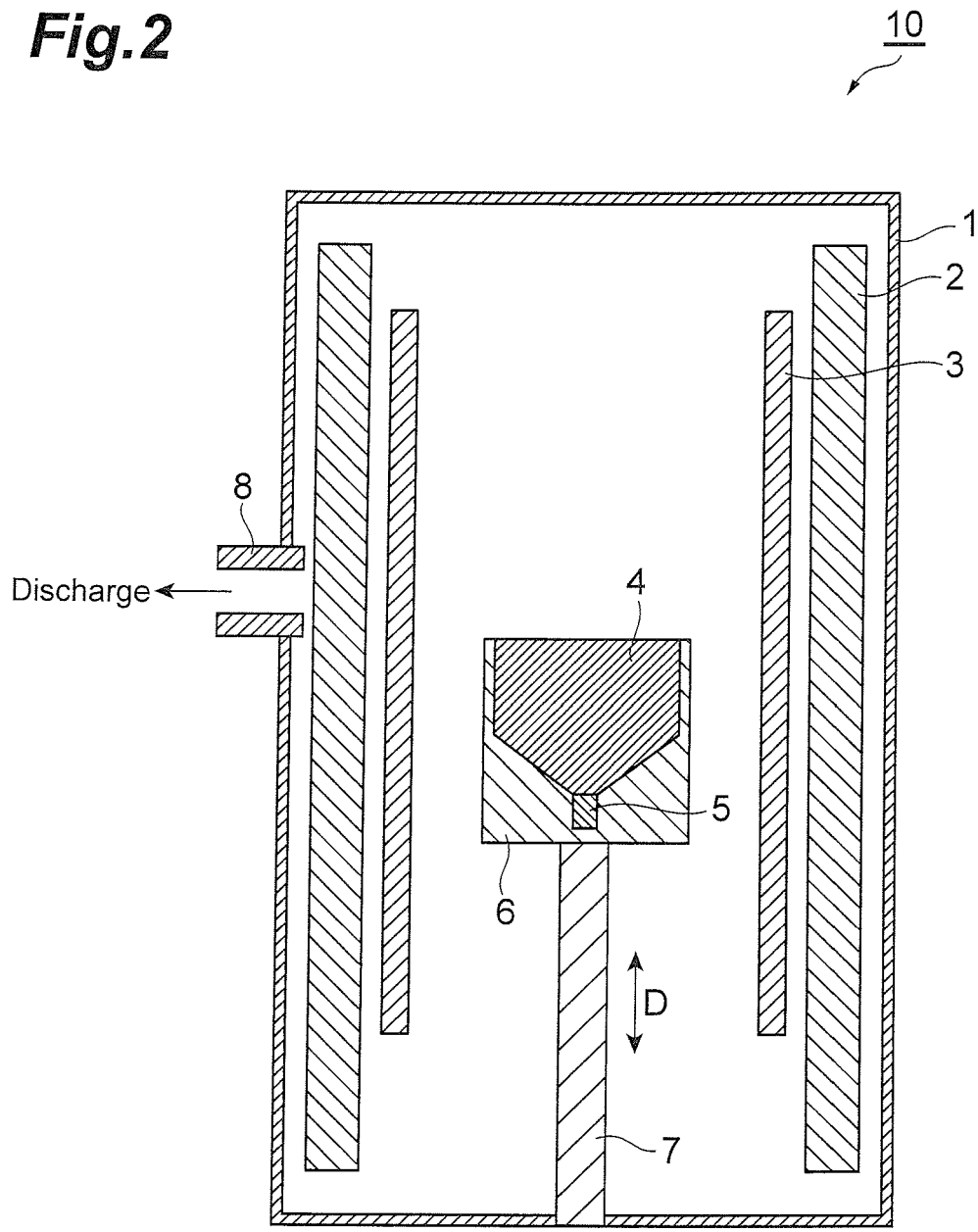
FIG. 2 is a schematic diagram showing the construction of a crystal growth furnace that may be suitably used for crystal growth according to the invention.

FIG. 2 is a diagram showing the structure of a crystal growth furnace wherein crystal growth of $BaMgF_4$ is accomplished. The hermetically sealable crystal growth furnace 10 shown in FIG. 2 has a double structure water-cooled by a SUS chamber 1. The SUS chamber 1 is provided with a container 6 in which crystal growth is accomplished, and a pair of heaters 3 situated sandwiching and facing the container 6. In the container 6 there are situated a seed crystal 5 as the starting material for the $BaMgF_4$ crystal, and a starting mixture 4.

The container 6 is placed at a prescribed height position in the chamber 1, by being mounted on a shaft 7 connected to the bottom part of the chamber 1. The heaters 3 are formed along the side walls of the chamber 1, and between the heaters 3 and the side walls of the chamber 1 there are respectively provided heat-insulating materials 2 to block the heat from the heaters 3. On one side wall of the chamber 1 there is provided a discharge vent 8 for discharge of gas in the chamber 1. The shaft 7 is water-cooled to prevent heat-induced deformation.

The container 6 in the crystal growth furnace 10 is movable in the vertical direction by the shaft 7, i.e. upwards and downwards along the movement direction axis D shown in FIG. 2. Heating with the heaters 3 that are outside of the container 6 produces a temperature gradient inside the crystal growth furnace 10 along the movement direction axis D. Due to this temperature gradient, the upper part in the crystal growth furnace 10 is at a higher temperature than the lower part. A ferroelectric fluoride single crystal can be produced by the vertical Bridgman method, using the crystal growth furnace 10 having such a construction.

The container 6 used may be a carbon or metal crucible that can be used in the vertical Bridgman method.

When such a crystal growth furnace 10 is to be used for production of a $BaMgF_4$ crystal, first starting materials with a purity of 99.9% or greater for formation of $BaMgF_4$ are prepared, and are mixed with a scavenger in the stoichiometric ratio of $BaMgF_4$, to obtain a starting mixture 4. After placing the starting mixture 4 in the container 6, the container 6 is set on the shaft 7 and disposed in the chamber 1. The $BaMgF_4$ seed crystal 5 is placed below the starting mixture 4 in the container 6.

The chamber 1 preferably has a water-cooled double structure, composed of SUS. The shaft 7 is also preferably water-cooled. This can prevent deformation of the chamber 1 or shaft 7 caused by heat from the heating described hereunder. Also, by water-cooling the shaft 7 it is possible to efficiently draw latent heat from the solidified material in the container 6.

After the container 6 containing the starting mixture 4 has been set on the shaft 7, the chamber 1 is closed and a vacuum system comprising an oil rotary pump or oil diffusion pump is used to create a vacuum in the chamber 1. Next, the heaters 3 are operated to increase the temperature in the chamber 1. In the crystal growth furnace 10, the heaters 3 are set so that the temperature increases from lower positions to higher positions. During the heating, first the container 6 is set at a low position and heated at a relatively low temperature. When the prescribed temperature has been reached, the container 6 is raised and heated at a higher temperature. The heating temperature is gradually increased in this manner. Movement of the container 6 can be accomplished by raising and lowering the shaft 7.

As the temperature increases with raising of the container 6, the starting mixture 4 in the container 6 begins to gradually melt from the top. As the container 6 is further raised, eventually reaching a position where the interface between the starting mixture 4 and seed crystal 5 in the container 6 is a solid-liquid interface, raising of the container 6 is stopped and the material in the container is allowed to stand for several hours until it becomes uniform. After a prescribed period of time has elapsed, the container 6 is gradually lowered to grow a crystal while the solid-liquid interface gradually moves upward.

By conducting crystal growth of the seed crystal at the bottom part of the container in this manner, it is possible to obtain a crystal with the desired orientation. During this time, the temperature gradient between the high-temperature zone and the low-temperature zone is maintained, and the container is positioned so that the lowermost part of the seed crystal does not melt while the uppermost part melts. This can yield a single crystal grown with the same crystal orientation as the seed crystal that has been left without melting.

As a separate method from that described above, the container 6 may be fixed at a prescribed position and the temperature surrounding the container 6 continuously varied to accomplish crystal growth from the position of the seed crystal 5.

Upon completion of crystal growth it is slowly cooled, and upon reaching room temperature, the pressure is restored by means such as introduction of inert gas into the chamber 1, and the container is removed and the $BaMgF_4$ single crystal obtained from it. The obtained single crystal is removed out of the container 6 and may be provided for cutting and shaping into, for example, a sheet oriented on the c-face.

For this embodiment, the single crystal growth direction of the ferroelectric fluoride single crystal is in the range of no greater than ±20° from the direction of the a-axis, b-axis or c-axis of the crystal axis, and preferably the growth is in an environment such that the single crystal growth direction and the temperature gradient direction within the range in which the single crystal grows are the same, or such that the angle between them is no greater than ±20°.

Such a single crystal can grow if the $BaMgF_4$ seed crystal 5 placed at the bottom part of the container 6 is situated so that it has a cross-section on the side in contact with the starting mixture 4 that is no greater than ±20° from the orientation of the a-face, b-face or c-face of the seed crystal, and the seed crystal 5 is placed so that the orientation of that cross-section matches the single crystal growth direction.

The starting mixture 4 housed in the container 6 may be a mixed powder obtained by combining $BaF_2$ powder and $MgF_2$ powder, as fluorine-based compounds, in a molar ratio of 1:1 for the stoichiometric ratio of $BaMgF_4$, and further mixing a scavenger therewith. The fluorine-based compounds used may be commercially available products, and from the viewpoint of obtaining a ferroelectric fluoride single crystal with adequate transmittance, it is preferred to use compounds with a purity of at least 99.9 wt %. The scavenger is an additive substance added to induce fluorination of the trace oxides in the powder of the fluorine-based compounds. By adding a scavenger to the starting material, it is possible to remove the oxides that can cause coloration or reduced internal transmittance of the fluoride single crystal. However, if the scavenger itself remains in the ferroelectric fluoride single crystal, this can also cause coloration or reduced internal transmittance of the ferroelectric fluoride single crystal. Consequently, the scavenger is preferably added at 0.001-10 wt % with respect to the fluorine-based compounds. This will allow the oxides to be sufficiently removed while adequately reducing residue of the scavenger in the ferroelectric fluoride single crystal.

Preferred as scavengers are one or more fluorides selected from the group consisting of polytetrafluoroethylene (PTFE), $SnF_2$, $SbF_3$, $GaF_3$, $BiF_3$, $TiF_3$, $PbF_2$, $ZnF_2$, $ZrF_4$ and $HfF_4$.

Although the crystal growth furnace 10 interior is evacuated for this embodiment, the atmosphere in the furnace may instead be exchanged with an inert gas atmosphere of helium gas, argon gas or nitrogen gas, a reducing gas atmosphere such as hydrogen gas, or a fluorine-based gas atmosphere such as $CF_4$ or $C_2H_5F$, instead of a vacuum.

As shown in FIG. 1, the wavelength conversion element 12 is formed by periodic polarization reversal with a period of 20-80 nm, for example, with respect to the plate crystal consisting of the obtained ferroelectric fluoride single crystal oriented on the c-face. When light of the fundamental wave 11 is incident from one end of the wavelength conversion element 12, the ferroelectric domain in the wavelength conversion element 12 is periodically reversed so that the fundamental wave 11 undergoes quasi-phase-matching, generating a second harmonic 13 which is emitted (outputted) from the other end of the wavelength conversion element 12. As a result, it is possible for the wavelength conversion element 12 to generate light of twice the frequency of the incident light.

Such a wavelength conversion element 12 can be used to obtain light of different wavelengths, according to the purpose of use. For example, the wavelength conversion element 12 may be suitably used so that, of the light emitted by wavelength conversion, at least one of the wavelengths is no greater than 500 nm, or at least 1500 nm, or to generate light with a frequency in the terahertz range.

The inorganic optical filter 15 consists of a $NdF_3$ single crystal. The $NdF_3$ single crystal can also be obtained using the crystal growth furnace 10 illustrated in FIG. 2, similar to the $BaMgF_4$ described above.

When the crystal growth furnace 10 is to be used for production of a $NdF_3$ single crystal, first the starting materials with a purity of 99.9% or greater for formation of the $NdF_3$ single crystal are prepared, and are mixed with a scavenger for the stoichiometric ratio of $NdF_3$, to obtain a starting mixture 4. After placing the starting mixture 4 in the container 6, the container 6 is set on the shaft 7 and disposed in the chamber 1. The $NdF_3$ seed crystal 5 is placed below the starting mixture 4 in the container 6.

After the container 6 containing the starting mixture 4 has been set on the shaft 7, the chamber 1 is closed and a vacuum system comprising an oil rotary pump or oil diffusion pump is used to create a vacuum in the chamber 1. Next, the heaters 3 are operated to increase the temperature in the chamber 1. In the crystal growth furnace 10, the heaters 3 are set so that the temperature increases from lower positions to higher positions. During the heating, first the container 6 is set at a low position and heated at a relatively low temperature. When the prescribed temperature has been reached, the container 6 is raised and heated at a higher temperature. The heating temperature is gradually increased in this manner. Movement of the container 6 can be accomplished by raising and lowering the shaft 7.

As the temperature increases with raising of the container 6, the starting mixture 4 in the container 6 begins to gradually melt from the top. As the container 6 is further raised, eventually reaching a position where the interface between the starting mixture 4 and seed crystal 5 in the container 6 is a solid-liquid interface, raising of the container 6 is stopped and the material in the container is allowed to stand for several hours until it becomes uniform. After a prescribed period of time has elapsed, the container 6 is gradually lowered to grow a crystal while the solid-liquid interface gradually moves upward.

By conducting crystal growth of the seed crystal at the bottom part of the container in this manner, it is possible to obtain a crystal with the desired orientation. During this time, the temperature gradient between the high-temperature zone and the low-temperature zone is maintained, and the container is positioned so that the lowermost part of the seed crystal does not melt while the uppermost part melts. This can yield a single crystal grown with the same crystal orientation as the seed crystal that has been left without melting.

As a separate method from that described above, the container 6 may be fixed at a prescribed position and the temperature surrounding the container 6 continuously varied to accomplish crystal growth from the position of the seed crystal 5.

Upon completion of crystal growth it is slowly cooled, and upon reaching room temperature, the pressure is restored by means such as introduction of inert gas into the chamber 1, and the container is removed and the $NdF_3$ single crystal obtained from it. The obtained single crystal is removed out of the container 6 and may be provided for cutting and shaping into, for example, a sheet oriented on the c-face.

For this embodiment, the $NdF_3$ single crystal preferably has the single crystal growth direction matching the direction of the a-axis, b-axis or c-axis among the crystal axes, or within no greater than ±30° from the direction of the a-axis, b-axis or c-axis among the crystal axes. Also, the $NdF_3$ single crystal is preferably grown in an environment such that the single crystal growth direction matches the temperature gradient direction in the range in which the single crystal grows, or so that the angle between them is within no greater than ±30°.

Such a single crystal can grow if the $NdF_3$ seed crystal 5 placed at the bottom part of the container 6 is situated so that it has a cross-section on the side in contact with the starting mixture 4 that is no greater than ±30° from the orientation of the a-face, b-face or c-face of the seed crystal, and the seed crystal 5 is placed so that the orientation of that cross-section matches the single crystal growth direction.

The starting mixture 4 housed in the container 6 may be powder comprising at least one type of Nd-containing fluorine-based compound, or a fluoride starting material comprising the solidified powder as a single crystal or polycrystal, which is mixed with a scavenger. The Nd-containing fluorine-based compound may be, for example, neodymium fluoride ($NdF_3$). The Nd-containing fluorine-based compound used may be a commercially available product, and from the viewpoint of obtaining a ferroelectric fluoride single crystal with adequate transmittance, it is preferred to use a compound with a purity of at least 99.9 wt %.

Preferred as scavengers are one or more fluorides selected from the group consisting of polytetrafluoroethylene (PTFE), $SnF_2$, $SbF_3$, $GaF_3$, $BiF_3$, $TiF_3$, $PbF_2$, $ZnF_2$, $ZrF_4$ and $HfF_4$. The scavenger is preferably combined at a ratio of 0.001-10 wt % with respect to the fluorine starting material. This will allow the oxides to be sufficiently removed while adequately reducing residue of the scavenger in the $NdF_3$ single crystal.

Although the crystal growth furnace 10 interior is evacuated for this embodiment, the atmosphere in the furnace may instead be exchanged with an inert gas atmosphere of helium gas, argon gas or nitrogen gas, a reducing gas atmosphere such as hydrogen gas, or a fluorine-based gas atmosphere such as $CF_4$ or $C_2H_5F$, instead of a vacuum.

The inorganic optical filter 15 consists of a $NdF_3$ single crystal obtained in this manner is set in the optical path of light emitted from the wavelength conversion element 12, as shown in FIG. 1. The inorganic optical filter 15 removes the fundamental wave 14 included in light emitted from the wavelength conversion element 12, thus allowing adequate output of the second harmonic 13.

The inorganic optical filter consists of a $NdF_3$ single crystal according to the invention has a high blocking property for fundamental waves of multiple wavelengths, while having high transparency for their second harmonics. In contrast, conventional wavelength optical filters only have a filter function for a fixed range in a target wavelength range, and in that sense they have been monofunctional and difficult to apply for different types of laser light. Moreover, conventional wavelength optical filters for the region from the visible to the near-infrared range have not had total shielding capacity, i.e. the ability to provide 100% shielding, and even with optical filters rated with transmittance of no greater than 1%, the shielding capacity is often at a low enough level that light can be visually confirmed. Therefore, it has been necessary to increase the filter material thickness in conventional wavelength optical filters for the region from the visible to near-infrared range, in order to obtain shielding capacity of 100%. However, increasing the filter material thickness, which lowers transmittance, significantly reduces (attenuates) the SHG light intensity that is to be passed.

The light source of the invention can be constructed by combining the optical element of the aforementioned embodiment, with a solid laser that directs laser light to the wavelength conversion element of the optical element.

For this embodiment, the wavelength of the laser light is preferably in the wavelength range with a transmittance of no greater than 3%, and more preferably in a wavelength range of no greater than 1%, in the light transmitting spectrum of the inorganic optical filter.

Solid lasers that emit such laser light include ruby lasers, YAG lasers, titanium sapphire lasers and the like.

The light source of this embodiment preferably comprises a titanium sapphire laser as the solid laser, from the viewpoint of low cost and allowing relatively stable oscillation of the second harmonic in the vacuum ultraviolet range.

EXAMPLES

The present invention will now be explained in greater detail by examples, with the understanding that the invention is not limited by the examples.

<Fabrication of Wavelength Conversion Element>
(Wavelength Conversion Element 1)

The apparatus illustrated in FIG. 2 was used to obtain an optical material consisting of a $BaMgF_4$ single crystal, by the method described above. Specifically, first 368.91 g of a $BaF_2$ starting powder (purity: ≥99.9%) and 131.09 g of a $MgF_2$ starting powder (purity: ≥99.9%) were weighed out (molar ratio=1:1), and were mixed with 1.00 g of $BiF_3$ as a scavenger to obtain a mixed powder. The mixed powder was placed in a carbon container 6, and the container 6 was set at the lower end of the crystal growth furnace 10 shown in FIG. 2. After reducing the pressure in the crystal growth furnace 10 to no higher than $10^{-3}$ Pa, the heaters 3 were heated to 1000° C., and the container 6 was gradually increased in temperature to a high-temperature range (≥500° C.) for melting of the mixed powder. Next, the container 6 was gradually lowered in temperature to a low-temperature range (<500° C.) for crystal growth, and then the crystal growth furnace 10 interior was slowly cooled to obtain an optical material consisting of a $BaMgF_4$ single crystal.

A thin sample consisting of a plate crystal oriented on the c-face was taken from the obtained optical material and subjected to periodic polarization reversal with a period of 20-80 nm with respect to the plate crystal, as shown in FIG. 1, to form a wavelength conversion element.

Light with a wavelength of 1064 nm, as the fundamental wave 11, was directed from one end of the wavelength conversion element using a Nd:YAG laser. As a result, the fundamental wave underwent quasi-phase-matching by periodic reversal of the ferroelectric domain in the wavelength conversion element, generating a second harmonic. The outputted light was green light with a wavelength of 532 nm. It was thus confirmed that the wavelength conversion element generates light of twice the frequency of the incident light.

Also, upon directing light with a wavelength of 812 nm from one end of the wavelength conversion element in the same manner using a titanium sapphire laser, as the fundamental wave, the outputted light was violet light with a wavelength of 406 nm.

Further, upon directing light with a wavelength of 792 nm from one end of the wavelength conversion element in the same manner using a titanium sapphire laser, as the fundamental wave, the outputted light was green light with a wavelength of 396 nm.

<Fabrication of Inorganic Optical Filter>
(Filter 1)

The apparatus illustrated in FIG. 2 was used to obtain an optical material consisting of a $NdF_3$ single crystal, by the method described above. Specifically, first 500 g of a $NdF_3$ starting powder with a purity of 99.99% was mixed with 1.0 g of $BiF_3$ powder as a scavenger to obtain a mixed powder. The mixed powder was placed in a carbon container 6, and the container 6 was set at the lower end of the crystal growth furnace 10 shown in FIG. 2. After reducing the pressure in the crystal growth furnace 10 to no higher than $10^{-3}$ Pa, the temperature in the crystal growth furnace was increased with the heaters 3, and a low temperature (no higher than about 500° C.) was set at the low position in the furnace while a high temperature (about 1500° C.) was set at the high position. When the temperature at the high position in the furnace reached about 1500° C., the container was gradually raised at a rate of 1.0 mm/h toward the high-temperature zone, and the starting material at the uppermost part of the container was melted. The container was further raised, and upon reaching a position where the seed crystal in the container exhibited a solid-liquid interface, raising of the container was stopped and it was allowed to stand for 12 hours until the container contents become uniform. Next, the container was lowered at a rate of 0.5 mm/h toward the low-temperature zone which was no higher than about 500° C., and crystal growth was conducted by moving the solid-liquid interface upward. The crystal growth furnace 10 interior was then allowed to cool, and upon reaching room temperature, the pressure in the furnace was restored with inert gas or the like. The container was removed out to obtain an optical material consisting of a $NdF_3$ single crystal.

The obtained optical material was cut and shaped to form a filter consisting of a plate crystal with a thickness of 1 mm, oriented on the c-face.

Figure 3:
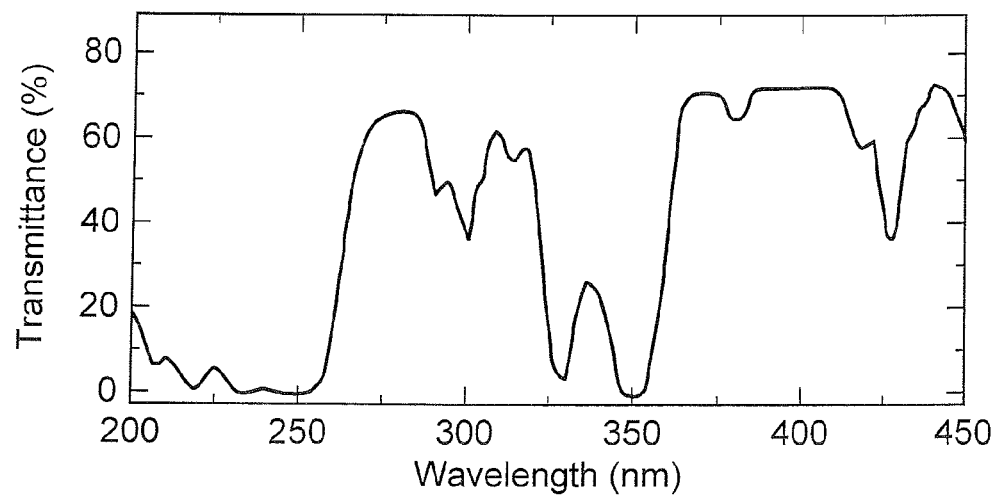
FIG. 3 is a diagram showing the light transmitting spectrum of a $NdF_3$ single crystal according to the invention.
Figure 3:
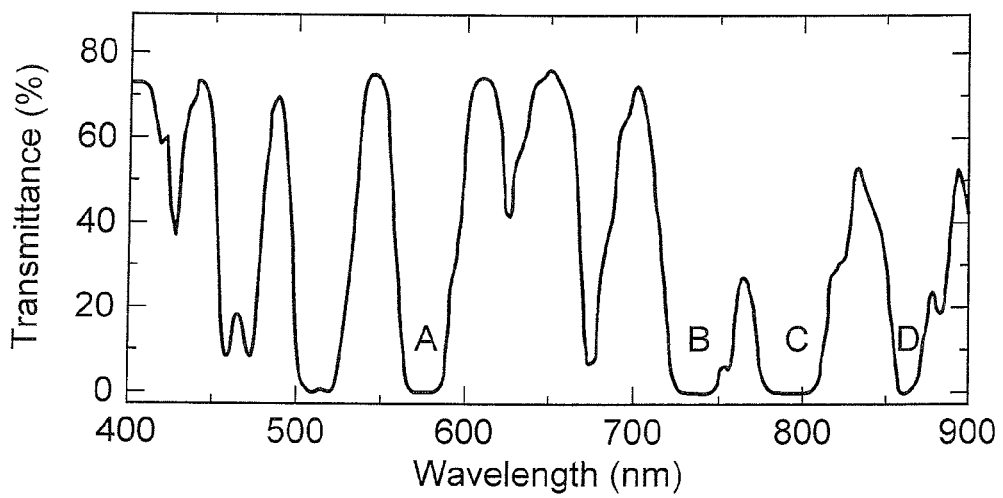

FIG. 3 shows the light transmitting spectrum of a filter consisting of the $NdF_3$ single crystal obtained as described above. FIG. 3(a) shows the light transmitting spectrum at 200-450 nm, and FIG. 3(b) shows the light transmitting spectrum at 400-900 nm. It was confirmed that in the light transmitting spectrum of the 400-900 nm wavelength range shown in FIG. 3(b), 4 ranges are present, A, B, C and D, in which the transmittance is no greater than 1%, and several locations had a transmittance of 70% or greater.

More specifically, ranges A, B, C and D with transmittances of no greater than 1% were at the range of 565 nm to 585 nm, the range of 726 nm to 747 nm, the range of 778 nm to 812 nm and the range of 855 nm to 870 nm, respectively. The half wavelength ranges corresponding to each of these ranges had transmittances of at least 50%. Also, the half wavelength ranges corresponding to ranges B and C had transmittances of 70% or greater.

This indicates that an inorganic optical filter consisting of a $NdF_3$ single crystal according to the invention has a function of blocking light with a fundamental wave in any of the wavelength ranges A-D, and transmitting light in the half wavelength range of any of wavelength ranges A-D, as the second harmonic. Since the inorganic optical filter of the invention thus comprises a filter function for multiple wavelength ranges, it can provide flexibility for construction of optical systems. Furthermore, since it is not necessary to combine multiple optical filters, it is possible to achieve smaller size and reduced cost for optical systems.

Figure 4:
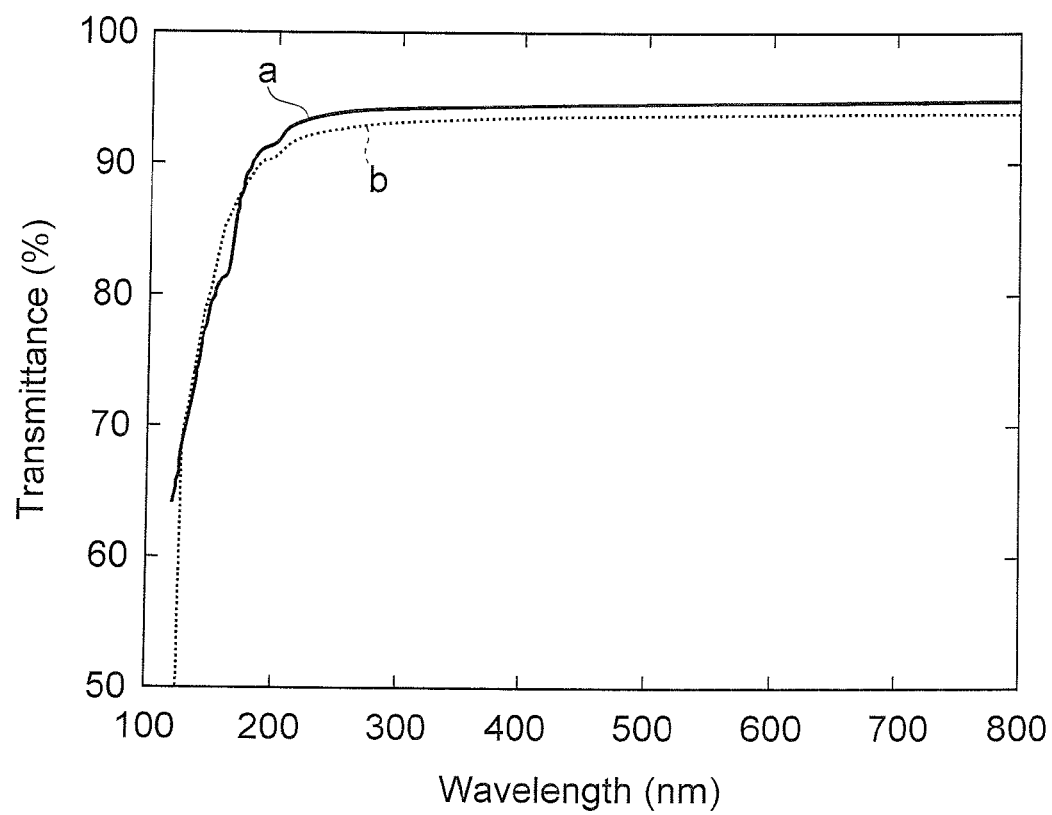
FIG. 4 is a diagram showing the light transmitting spectrum of a $CaF_2$ single crystal and a $MgF_2$ single crystal.

FIG. 4 shows the light transmitting spectrum of a $CaF_2$ single crystal and a $MgF_2$ single crystal, for comparison. In FIG. 4, "a" represents the spectrum of a $MgF_2$ single crystal, and "b" represents the spectrum of a $CaF_2$ single crystal. In these light transmitting spectra, no range with transmittance of 1% or lower is seen within 200-800 nm.

(Filter C-1)

A Dichroic Color Filter (Additive Filters: Red) (thickness: 1 mm), trade name of Thorlabs, was prepared.

Only the single range of 380-550 nm had a transmittance of 1% or lower in the light transmitting spectrum of the filter.

(Filter C-2)

A Camera Lens Color Filter B-440 (thickness: 1 mm), trade name of HOYA Glass, was prepared.

Example 1

A wavelength conversion element 1 and a filter 1 were arranged as shown in FIG. 1, to prepare an optical element. The wavelength conversion element 1 of this optical element was irradiated from one end with light of a wavelength of 812 nm using a titanium sapphire laser, as the fundamental wave, and the transmittance and second harmonic transmittance of outputted light from the other end of the wavelength conversion element 1 and outputted light passing through the filter 1 were measured using a vacuum ultraviolet spectrophotometer (KV-201V, by Bunkoukeiki Co., Ltd.). The fundamental wave transmittance and second harmonic transmittance of the filter 1 were each calculated by the vacuum ultraviolet spectrophotometer. The results are shown in Table 1.

Example 2

The fundamental wave transmittance and second harmonic transmittance were determined in the same manner as Example 1, except that a titanium sapphire laser was used as the laser light source, and light with a wavelength of 792 nm was directed from the end of the wavelength conversion element 1. The results are shown in Table 1.

Comparative Example 1

The fundamental wave transmittance and second harmonic transmittance were determined in the same manner as Example 1, except that filter C-1 was used instead of the filter 1. The results are shown in Table 1.

Comparative Example 2

The fundamental wave transmittance and second harmonic transmittance were determined in the same manner as Example 2, except that filter C-1 was used instead of the filter 1. The results are shown in Table 1.

Comparative Example 3

The fundamental wave transmittance and second harmonic transmittance were determined in the same manner as Example 1, except that filter C-2 was used instead of the filter 1. The results are shown in Table 1.

TABLE 1

| | Example 1 | Example 2 | Comp. Ex. 1 | Comp. Ex. 2 | Comp. Ex. 3 |
|---|---|---|---|---|---|
| Laser light source | Titanium sapphire laser | Titanium sapphire laser | Titanium sapphire laser | Titanium sapphire laser | Titanium sapphire laser |
| Wavelength conversion element material | $BaMgF_4$ | $BaMgF_4$ | $BaMgF_4$ | $BaMgF_4$ | $BaMgF_4$ |
| Filter | Filter 1 | Filter 1 | Filter C-1 | Filter C-1 | Filter C-2 |
| Fundamental wavelength (nm) | 812 | 792 | 812 | 792 | 812 |
| Second harmonic (nm) | 406 | 396 | 406 | 396 | 406 |
| Fundamental wavelength transmittance (%) | 0.5 | 0.5 | 5.2 | 5.2 | 3.5 |
| Second harmonic transmittance (%) | 99.9 | 99.9 | 99.9 | 99.9 | 31.0 |

REFERENCE SIGNS LIST

1: Chamber, 2: heat-insulating material, 3: heater, 4: starting mixture, 5: seed crystal, 6: container, 7: shaft, 8: discharge vent, 10: crystal growth furnace, 11: fundamental wave, 12: wavelength conversion element, 13: second harmonic, 14: fundamental wave, 15: inorganic filter, 100: optical element.

The invention claimed is:

1. An optical element comprising a wavelength conversion element wherein incident light is subjected to wavelength conversion to twice the frequency by quasi-phase-matching using primary matching or tertiary matching, and emitted, and an inorganic optical filter situated in the optical path of light emitted from the wavelength conversion element,
   wherein the wavelength conversion element consists of a ferroelectric fluoride single crystal represented by $Ba_{1-y}(Mg_{1-x}Zn_x)_{1+y}F_4$ (where $0 \leq x \leq 1$, and $-0.2 \leq y \leq 0.2$), and the inorganic optical filter consists of a $NdF_3$ single crystal.

2. The optical element according to claim 1, wherein the ferroelectric fluoride single crystal is a $BaMgF_4$ single crystal.

3. A light source comprising the optical element according to claim 1 and a solid laser which directs laser light to the wavelength conversion element of the optical element.

4. The light source according to claim 3, wherein the wavelength of the laser light is in the wavelength range with a transmittance of no greater than 3% within the light transmitting spectrum of the inorganic optical filter.

5. The optical element according to claim 1, wherein the $NdF_3$ single crystal has 4 wavelength ranges with transmittance of no greater than 1% within the wavelength range of 550-900 nm, and the transmittance in each of the half-wavelength ranges corresponding to the 4 wavelength ranges is 50% or greater.

6. The optical element according to claim 5, wherein the ferroelectric fluoride single crystal is a $BaMgF_4$ single crystal.

7. A light source comprising the optical element according to claim 5 and a solid laser which directs laser light to the wavelength conversion element of the optical element.

8. The light source according to claim 7, wherein the wavelength of the laser light is in the wavelength range with a transmittance of no greater than 3% within the light transmitting spectrum of the inorganic optical filter.

* * * * *